United States Patent
Kim et al.

(10) Patent No.: US 7,911,756 B2
(45) Date of Patent: *Mar. 22, 2011

(54) LOW-VOLTAGE NOISE PREVENTING CIRCUIT USING ABRUPT METAL-INSULATOR TRANSITION DEVICE

(75) Inventors: Hyun-Tak Kim, Daejeon (KR); Kwang-Yong Kang, Daejeon (KR); Byung-Gyu Chae, Daejeon (KR); Bong-Jun Kim, Daejeon (KR); Yong-Wook Lee, Seoul (KR); Sun-Jin Yun, Daejeon (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 782 days.

This patent is subject to a terminal disclaimer.

(21) Appl. No.: 11/908,837

(22) PCT Filed: Mar. 7, 2006

(86) PCT No.: PCT/KR2006/000778
§ 371 (c)(1),
(2), (4) Date: Sep. 17, 2007

(87) PCT Pub. No.: WO2006/098560
PCT Pub. Date: Sep. 21, 2006

(65) Prior Publication Data
US 2008/0197916 A1    Aug. 21, 2008

(30) Foreign Application Priority Data

Mar. 18, 2005 (KR) .................. 10-2005-0022681
Jan. 6, 2006 (KR) .................. 10-2006-0001677

(51) Int. Cl.
*H02H 9/00* (2006.01)
(52) U.S. Cl. ...................................................... 361/111
(58) Field of Classification Search .................. 361/111
See application file for complete search history.

(56) References Cited

U.S. PATENT DOCUMENTS

| | | | |
|---|---|---|---|
| 6,333,543 B1 | 12/2001 | Schrott et al. | |
| 6,365,913 B1 | 4/2002 | Misewich et al. | |
| 6,624,463 B2 | 9/2003 | Kim et al. | |
| 7,408,217 B2 * | 8/2008 | Yoon et al. | 257/310 |
| 7,489,492 B2 * | 2/2009 | Kim et al. | 361/111 |

FOREIGN PATENT DOCUMENTS

JP    62-282411 A    12/1987

(Continued)

OTHER PUBLICATIONS

International Search Report and Written Opinion for PCT/KR2006/000778 dated Jun. 8, 2006.

(Continued)

*Primary Examiner* — Stephen W Jackson
(74) *Attorney, Agent, or Firm* — Kile Park Goekjian Reed & McManus PLLC

(57) ABSTRACT

Provided are a low-voltage noise preventing circuit using an abrupt metal-insulator transition (MIT) device which can effectively remove a noise signal with a voltage less than a rated signal voltage. The abrupt MIT device is serially connected to the electrical and/or electronic system to be protected from the noise signal, and is subject to abrupt MIT at a predetermined voltage. Accordingly, low-voltage noise can be effectively removed.

23 Claims, 7 Drawing Sheets

FOREIGN PATENT DOCUMENTS

| | | |
|---|---|---|
| JP | 02-215112 A | 8/1990 |
| JP | 2000-243606 A | 9/2000 |
| KR | 1020040099797 | 12/2002 |

OTHER PUBLICATIONS

Office Action dated Feb. 2, 2010 and issued in counterpart Japanese Application No. 2008-501802.

Hyun-Tak Kim et al., "Raman study of electric-field-induced first-order metal-insulator transition in VO2-based devices", Applied Physics Letters 86.242101 pp. 103 (2005).

Doo-Hyeb Youn et al., "Observation of Abrupt Metallic Transitions in p-Type GaAs Devices and Comparison with Avalanche Breakdown in the InGaAs APD", Journal of the Korean Physical Society, vol. 47, No. 1, Jul. 2005, pp. 1-5.

Hyun-Tak Kim et al., "Mechanism and Observation of MOTT Transition in VO2-based two- and three-terminal devices", New Journal of Physics 6(52), May 17, 2004, pp. 1-19.

* cited by examiner ly change according to a voltage level of the noise. The abrupt MIT device may have a characteristic of an insulator below a predetermined limit voltage and have a characteristic
LOW-VOLTAGE NOISE PREVENTING CIRCUIT USING ABRUPT METAL-INSULATOR TRANSITION DEVICE

CROSS-REFERENCE TO RELATED PATENT APPLICATIONS

This application is a 371 national stage application of International Application No. PCT/KR2006/000778 filed on Mar. 7, 2006, which claims priority to Korean Patent Application Nos. 10-2005-0022681, filed on Mar. 18, 2005 and 10-2006-0001677 filed Jan. 6, 2006, the disclosures of which are incorporated herein in their entirety by reference.

BACKGROUND OF THE INVENTION

1. Field of the Invention

The present invention relates to a circuit for protecting an electrical and/or electronic system, and more particularly, to a circuit for removing an external low-voltage noise signal applied to an electrical and/or electronic system.

2. Description of the Related Art

Noise that affects electronic components flows in through a power line that supplies power to an electric and/or electronic system and a signal line that receives and outputs an electrical signal from and to the electric and/or electronic system. Accordingly, a noise preventing circuit for protecting the electrical and/or electronic system from noise is connected to the power line and the signal line. The noise preventing circuit is required by almost all electronic products, such as, computers, image apparatuses, acoustic apparatuses, all controllers that control electronic products, etc.

Noise signals coming via the power line or the signal line are generally blocked by a low pass filter (LPF), a high pass filter (HPF), or a noise filter. Each of these filters is generally made up of a resistor (R), an inductor (L), and a capacitor (C). Accordingly, these filters are quite big and expensive. This impedes the miniaturization and popularization of electronic apparatuses. In particular, there is a limit to reduction of the sizes of the filters. In addition, there is a problem in that both the LPF and HPF must be installed at a single power or signal line.

Furthermore, these filters cannot remove a low-voltage noise signal, such as, a room temperature noise signal. The low-voltage noise signal has a voltage lower than a rated signal voltage or a rated power voltage. Examples of the low-voltage noise signal include a noise signal that hinders production of clear sounds and clean images, a noise signal that prevents precise recognition of the low value of a digital signal, an RF signal noise that is applied to a power or supply line, etc.

SUMMARY OF THE INVENTION

The present invention provides a circuit that can effectively remove a noise signal with a voltage less than a rated standard voltage when the noise signal flows into an electrical and/or electronic system via a power line and/or a signal line.

According to an aspect of the present invention, there is provided a low-voltage noise preventing circuit including an abrupt metal-insulator transition (MIT) device serially connected to an electrical and/or electronic system to be protected from noise.

The electrical characteristics of the abrupt MIT device may abruptly change according to a voltage level of the noise. The abrupt MIT device may have a characteristic of an insulator below a predetermined limit voltage and have a characteristic of a metal at or over the limit voltage. The low-voltage noise preventing circuit may further include a protecting resistor serially connected to the abrupt MIT device.

According to another aspect of the present invention, there is provided a low-voltage noise preventing circuit including a first abrupt MIT device serially connected to an electrical and/or electronic system to be protected from noise, and a second abrupt MIT device connected to the electrical and/or electronic system in parallel.

The low-voltage noise preventing circuit may further include a first protecting resistor and a second protecting resistor serially connected to the first and second abrupt MIT devices, respectively. The low-voltage noise preventing circuit may also further include a power voltage reinforcing capacitor connected in parallel to a power voltage source which supplies a power voltage to the electrical and/or electronic system. The low-voltage noise preventing circuit can remove not only low-voltage noise but also high-voltage noise using the second abrupt MIT device.

According to another aspect of the present invention, there is provided a low-voltage noise preventing circuit including a first abrupt metal-insulator transition device serially connected to an electrical and/or electronic system to be protected from noise, wherein the first abrupt metal-insulator transition device includes an abrupt metal-insulator transition thin film containing low-concentration holes and at least two electrode thin films that contact the abrupt metal-insulator transition thin film.

The abrupt metal-insulator transition thin film may be formed of at least one material selected from the group consisting of an inorganic semiconductor to which low-concentration holes are added, an inorganic insulator to which low-concentration holes are added, an organic semiconductor to which low-concentration holes are added, an organic insulator to which low-concentration holes are added, a semiconductor to which low-concentration holes are added, an oxide semiconductor to which low-concentration holes are added, and an oxide insulator to which low-concentration holes are added. The above-described materials each include at least one of oxygen, carbon, a semiconductor element (i.e., groups III-V and groups II-IV), a transition metal element, a rare-earth element, and a lanthanum-based element.

Each of the electrode thin films may be formed of at least one material selected from the group consisting of W, Mo, W/Au, Mo/Au, Cr/Au, Ti/W, Ti/Al/N, Ni/Cr, Al/Au, Pt, Cr/Mo/Au, $YB_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/W/Al.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
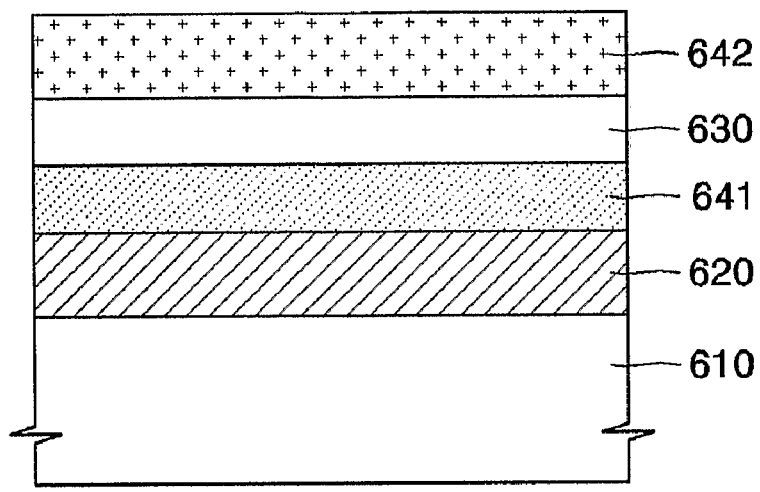
FIG. 1 is a cross-section of an abrupt metal-insulator transition (MIT) device having a stacked structure.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. To facilitate understanding, identical reference numerals have been used, where possible, to designate identical elements that are common to the figures.

The present invention proposes a low-voltage noise preventing circuit using a new medium whose electrical characteristics abruptly vary according to a voltage level of a received signal. The new medium is referred as a metal-insulator transition (MIT) device.

An abrupt MIT device used in the present invention includes an abrupt MIT thin film (hereinafter, referred to as a transition thin film), a first electrode thin film, and a second electrode thin film. The abrupt MIT device may have either a stacked (or vertical) structure or a planar-type structure according to the locations of the transition thin film and the first and second electrode thin films.

FIG. 1 is a cross-section of an abrupt MIT device having a stacked structure. Referring to FIG. 1, the abrupt MIT device having a stacked structure includes a substrate 610, a buffer layer 620 formed on the substrate 610, a first electrode thin film 641, a transition thin film 630, and a second electrode thin film 642. The first electrode thin film 641, the transition thin film 630, and the second electrode thin film 642 are sequentially formed on the buffer layer 620.

The buffer layer 620 buffers a lattice mismatch between the substrate 610 and the first electrode thin film 641. When the lattice mismatch between the substrate 610 and the first electrode thin film 641 is very small, the first electrode thin film 641 may be formed directly on the substrate 610 without the buffer layer 620. The buffer layer 620 may include a $SiO_2$ or $Si_3N_4$ film.

Each of the first and second electrode thin films 641 and 642 is formed of at least one material of W, Mo, W/Au, Mo/Au, Cr/Au, Ti/W, Ti/Al/N, Ni/Cr, Al/Au, Pt, Cr/Mo/Au, $YB_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/W/Al. The first and second electrode thin films 641 and 642 may be formed using at least one deposition method of a sputtering deposition method, a vacuum deposition method, and an E-beam deposition method.

The substrate 610 is formed of at least one material of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, Nb-doped $SrTiO_3$, and silicon-on-insulator (SOI).

The electrical characteristics of the abrupt MIT device of FIG. 1 abruptly change at a predetermined voltage applied between the first and second electrode thin films 641 and 624. In other words, the abrupt MIT device has a characteristic of an insulator below a predetermined voltage and has a characteristic of a metal at or over the predetermined voltage.

The transition of the electrical characteristic of the abrupt MIT device from the insulator to the metallic material is described in some papers, namely, New J. Physics 6 (2004) 52; http//xxx.lanl.gov/abs/con-mat/041328; and Appl. Phys. Lett. 86 (2005) 242101, and U.S. Pat. No. 6,624,463.

A voltage at which the electrical characteristic of an abrupt MIT device transits from an insulator to a metallic material is defined as a limit voltage. The limit voltage may vary according to the materials or structures of components of the abrupt MIT device.

Figure 2:
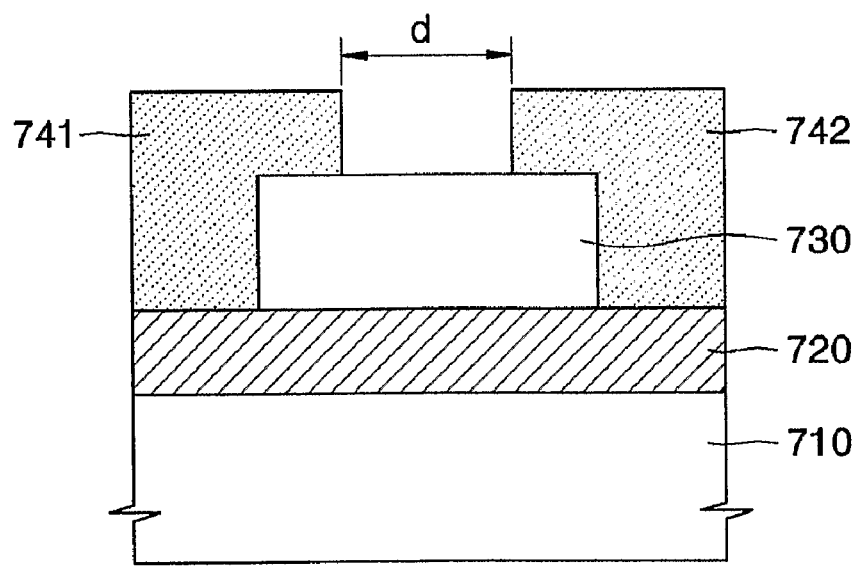
FIG. 2 is a cross-section of an abrupt MIT device having a planar-type structure.

FIG. 2 is a cross-section of an abrupt MIT device having a planar-type structure. Referring to FIG. 2, the abrupt MIT device having a planar-type structure includes a substrate 710, a buffer layer 720 formed on the substrate 710, a transition thin film 730 formed on a part of the upper surface of the buffer layer 720, and a first electrode thin film 741 and a second electrode thin film 742 which are formed on exposed portions of the buffer layer 720 and on lateral surfaces and an upper surface of the transition thin film 730 such as to face each other. In other words, the first and second electrode thin films 741 and 742 are separated from each other by the transition thin film 730 formed therebetween.

The buffer layer 720 buffers a lattice mismatch between the transition thin film 730 and the substrate 710. When the lattice mismatch between the substrate 710 and the transition thin film 730 is very small, the transition thin film 730 may be formed directly on the substrate 710 without forming the buffer layer 720 therebetween.

Of course, the buffer layer 720, the first and second electrode thin films 741 and 742, and the substrate 710 may be formed of the materials mentioned above in the description of FIG. 1. In contrast with the stacked abrupt MIT device of FIG. 1, a limit voltage for the planar-type abrupt MIT device of FIG. 2 may depend upon the horizontal distance "d" between the first and second electrode thin films 741 and 742.

Figure 3:
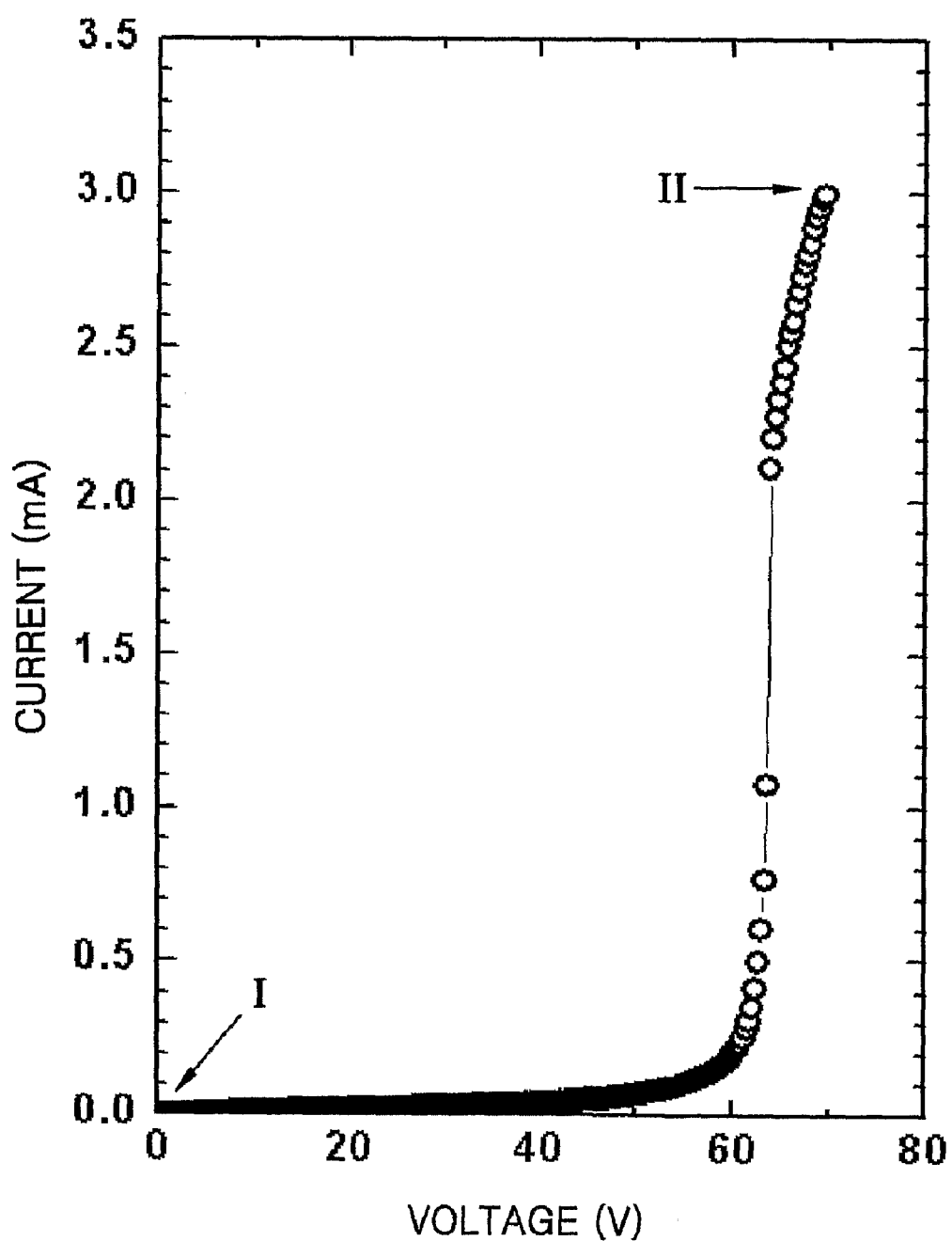
FIG. 3 is a graph showing a current-voltage curve of an abrupt planar-type MIT device as shown in FIG. 2.

FIG. 3 is a graph showing a current-voltage curve of the planar-type abrupt MIT device of FIG. 2 in which the transition thin film 730 is formed of a p-type GaAs thin film to which holes of a low concentration are added. The concentration of the added holes is about $3 \times 10^{16}$ cm$^{-3}$.

Referring to FIG. 3, current flowing in the planar-type abrupt MIT device increases with an increase in a voltage applied between the first and second electrode thin films 741 and 742. The current abruptly increases around 60V and increases according to the Ohm's law over about 60V. Accordingly, the limit voltage is about 60V. By comparing Laue patterns, namely, X-ray diffraction patterns of the planar-type abrupt MIT device at points I and II with each other, it is determined whether there is a difference between the structures of the abrupt MIT device before and after an abrupt MIT.

Figure 4:
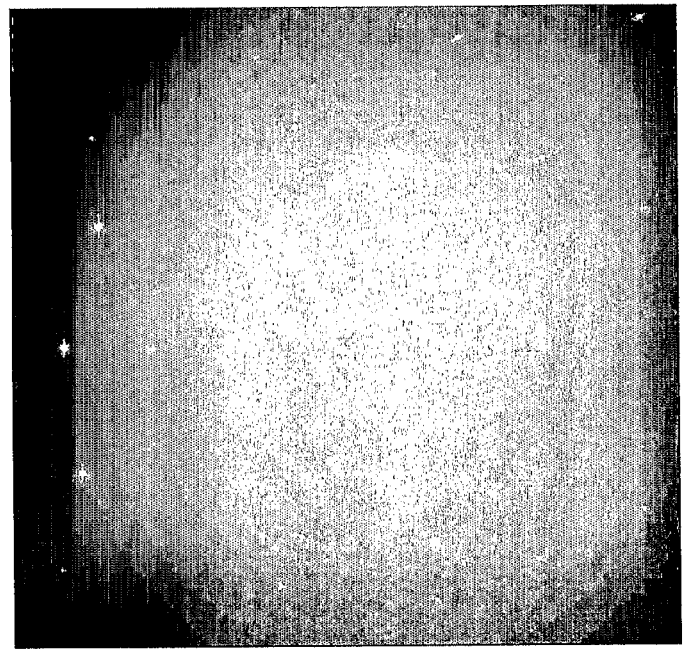
FIG. 4 is a picture of a micro X-ray diffraction pattern with respect to the abrupt MIT device of FIG. 3 where no voltages are applied.

FIG. 4 is a picture of a micro X-ray diffraction pattern with respect to the planar-type abrupt MIT device of FIG. 2 in a case I of FIG. 3 where no voltages are applied. In other words, FIG. 4 is a picture of a micro X-ray diffraction pattern when 0V is applied to the abrupt MIT device. The X-ray is incident between the first and second electrode thin films 741 and 742.

Figure 5:
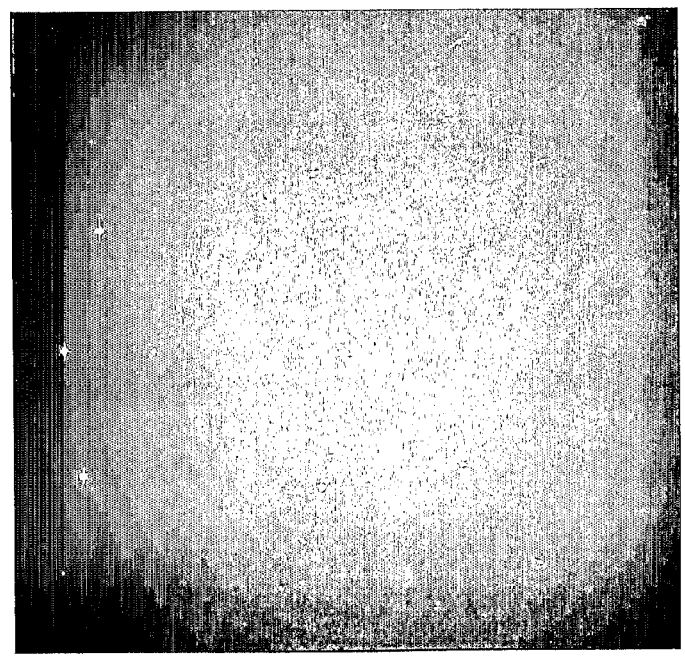
FIG. 5 is a picture of a micro X-ray diffraction pattern with respect to the abrupt MIT device of FIG. 3 when 70V is applied.

FIG. 5 is a picture of a micro X-ray diffraction pattern with respect to the abrupt MIT device in a case II of FIG. 3 where a voltage after an abrupt MIT is applied. As shown in FIG. 4, a voltage dropping through the abrupt MIT device is about 70V.

The diffraction patterns of FIGS. 4 and 5 are the same. This means that they have an identical structure. According to a steep inclination of the curve of FIG. 3, an MIT is considered abrupt. Referring to FIGS. 4 and 5, the structure of the abrupt MIT device did not change between before and after the abrupt MIT. Although the electrical conductivities of the abrupt MIT devices change abruptly, the structure of the transition thin film 730 does not change.

Such an abrupt MIT, that is, a fast switching operation, is achieved by the transition film of the abrupt MIT device. The transition film may be obtained by suitably adding low-concentration holes to an insulator. A mechanism for an abrupt MIT caused due to an addition of low-concentration holes to an insulator is disclosed in the papers and U.S. Patent mentioned above in the description of FIG. 1.

Each of the transition thin films 630 and 730, which cause an abrupt MIT to occur in the abrupt MIT devices of FIGS. 1 and 2, may be formed of at least one material selected from the group consisting of a p-type inorganic semiconductor to which low-concentration holes are added, a p-type inorganic insulator to which low-concentration holes are added, a p-type organic semiconductor to which low-concentration holes are added, a p-type organic insulator to which low-concentration holes are added, a p-type semiconductor to which low-concentration holes are added, a p-type oxide semiconductor to which low-concentration holes are added, and a p-type oxide insulator to which low-concentration holes are added. Each of the aforementioned materials includes at least one of oxygen, carbon, a semiconductor element (i.e., groups III-V and groups II-IV), a transition metal element, a rare-earth element, and a lanthanum-based element. The transition thin films 630 and 730 may also be formed of an n-type semiconductor-insulator having a very large resistance.

As described above, low-voltage noise preventing circuits according to embodiments of the present invention to be described below use an abrupt MIT device whose electrical characteristics abruptly change according to the level of a dropping voltage. The abrupt MIT device is connected in series to an electric and/or electronic system to be protected.

Figure 6:
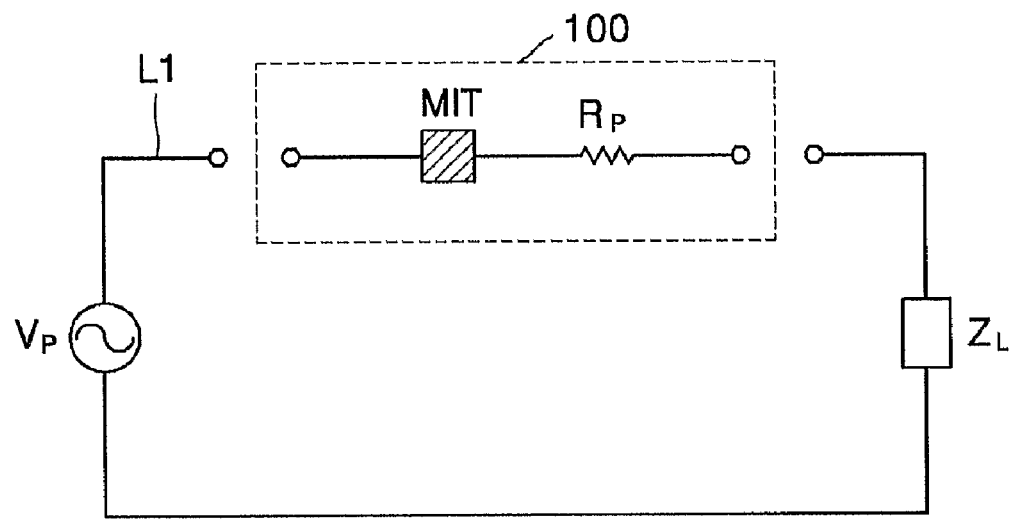
FIG. 6 illustrates a circuit including a low-voltage noise preventing circuit, according to an embodiment of the present invention.

FIG. 6 illustrates a circuit including a low-voltage noise preventing circuit 100, according to an embodiment of the present invention. Referring to FIG. 6, the low-voltage noise preventing circuit 100 includes an abrupt MIT device MIT and a protecting resistor $R_p$.

A load impedance $Z_L$ is an impedance equivalent to an electrical and/or electronic system and is used to verify the characteristics of the low-voltage noise preventing circuit 100. Hereinafter, $Z_L$ indicates an electrical and/or electronic system or a load impedance equivalent to the electrical and/or electronic system. Low-voltage noise may be applied via a power line L1 that applies a power voltage from a power voltage source $V_p$ to the electrical and/or electronic system $Z_L$. The electrical and/or electronic system $Z_L$ may be any electrical and/or electronic system as long as it needs to be protected from low-voltage noise, such as, all sorts of electronic devices, electrical components, electronic systems, or high-voltage electrical systems.

The protecting resistor $R_p$ is serially connected to the abrupt MIT device MIT and restricts a voltage or current that is applied to the abrupt MIT device MIT, to thereby protect the abrupt MIT device MIT. The protecting resistor $R_p$ and the abrupt MIT device MIT as a whole are serially connected to the power voltage source $V_p$ or the electrical and/or electronic system $Z_L$.

The resistance of the abrupt MIT device MIT may be controlled according to the material and structure of the device MIT. Alternatively, the overall resistance of the abrupt MIT device MIT may be lowered to an appropriate resistance by using at least one additional abrupt MIT device connected to the already-installed abrupt MIT device MIT in parallel.

The low-voltage noise preventing circuit 100 removes noise with a voltage less than a limit voltage by using the abrupt MIT device MIT serially connected to the electrical and/or electronic system $Z_L$. In other words, when noise with a voltage less than a predetermined voltage is applied to the electrical and/or electronic system $Z_L$, the abrupt MIT device MIT serially connected to the electrical and/or electronic system $Z_L$ via the protecting resistor $R_p$ acts as an insulator, so that low-voltage noise applied to the electrical and/or electronic system $Z_L$ is removed.

Figure 7:
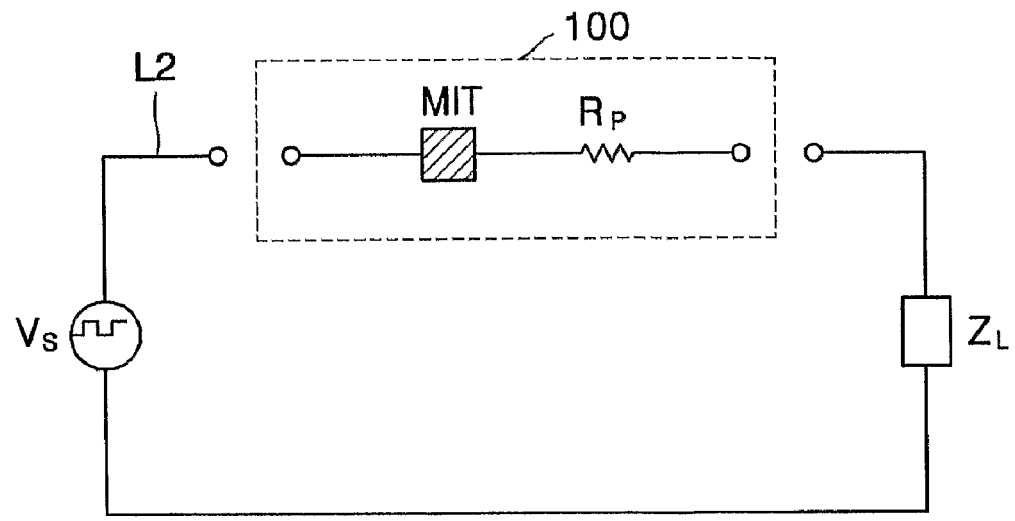
FIG. 7 illustrates a circuit including the low-voltage noise preventing circuit of FIG. 6, according to another embodiment of the present invention.

FIG. 7 illustrates a circuit including the low-voltage noise preventing circuit 100, according to another embodiment of the present invention. In this embodiment, even when low-voltage noise is applied to the electrical and/or electronic system $Z_L$ via a signal line L2 which transmits a signal, the low-voltage noise can be removed by serially connecting the low-voltage noise preventing circuit 100 to the electrical and/or electronic system $Z_L$. The low-voltage noise preventing circuit 100 includes a protecting resistor $R_p$ serially connected to an abrupt MIT device MIT. The role of the protecting resistor $R_p$ is the same as described in the embodiment of FIG. 6. A signal source $V_s$ generates an input/output signal for driving the electrical and/or electronic system $Z_L$. The signal source $V_s$ may be a pulse generator, an IC electronic component included in a computer, etc. The input/output signal may be applied as an analog signal or a digital signal. A noise signal with a voltage more irregular and smaller than a signal voltage is carried on the input/output signal to the electrical and/or electronic system $Z_L$.

In FIGS. 6 and 7, the power voltage source $V_p$ and the signal source $V_s$ are illustrated to be connected to separate electrical and/or electronic systems $Z_L$. However, in general, they may be simultaneously connected to a single electrical and/or electronic system $Z_L$. Of course, the power voltage and the input/output signal from the power voltage source $V_p$ and the signal source $V_s$, respectively, may be applied either via different lines or an identical line. The low-voltage noise preventing circuit 100 may be suitably connected to the different lines, but should be serially connected to the electrical and/or electronic system $Z_L$. As described above, the overall resistance of an abrupt MIT portion can be lowered by adding at least one abrupt MIT device to the already-installed abrupt MIT device MIT. The two abrupt MIT devices are connected to each other in parallel and are different from each other.

Figure 8:
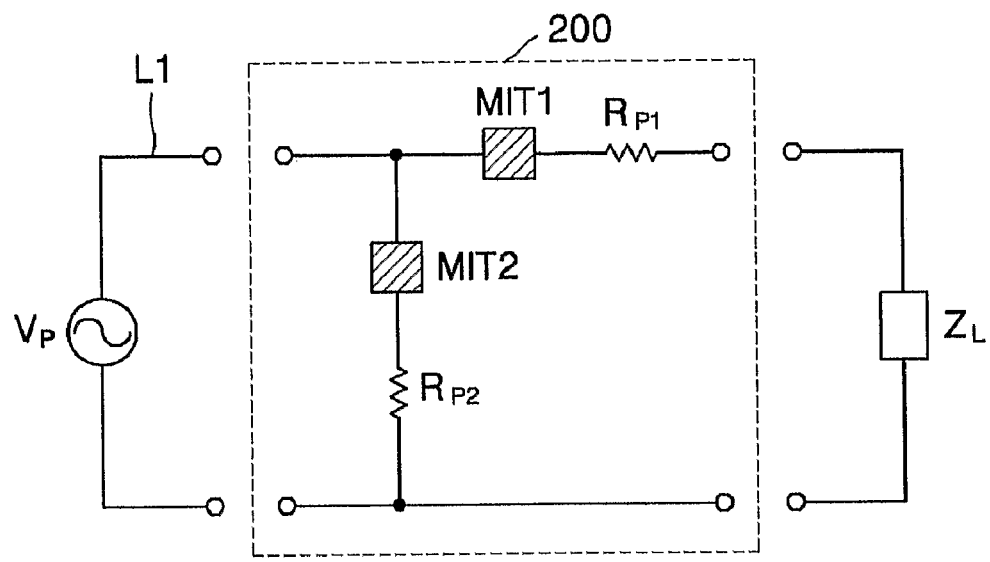
FIG. 8 illustrates a circuit including a low-voltage noise preventing circuit, according to another embodiment of the present invention.

FIG. 8 illustrates a circuit including a low-voltage noise preventing circuit 200, according to another embodiment of the present invention. In the embodiment of FIG. 8, when a high-voltage noise signal with a voltage equal to or greater than a rated standard voltage together with a low-voltage noise signal enters the electrical and/or electronic system $Z_L$ via a power voltage line L1, the electrical and/or electronic system $Z_L$ is protected from these noise signals.

Referring to FIG. 8, the low-voltage noise preventing circuit 200 includes a first abrupt MIT device MIT1 serially connected to the electrical and/or electronic system $Z_L$, a second abrupt MIT device MIT2 connected to the electrical and/or electronic system $Z_L$ in parallel, and protecting resistors $R_{p1}$ and $R_{p2}$ serially connected to the first and second abrupt MIT device MIT1 and MIT2, respectively. Although it is illustrated in FIG. 8 that the second abrupt MIT device MIT2 is connected to the electrical and/or electronic system $Z_L$ in parallel via the first abrupt MIT device MIT1, the second abrupt MIT device MIT2 may be directly connected to the electrical and/or electronic system $Z_L$ in parallel.

When high-voltage noise with a voltage equal to or greater than a rated standard voltage is applied to the electrical and/or electronic system $Z_L$ via the power voltage line L1, most of current flows through the second abrupt MIT device MIT2, whereby the electrical and/or electronic system $Z_L$ is protected from the high-voltage noise. Hence, in the embodiment of FIG. 8, the electrical and/or electronic system $Z_L$ is protected from both low-voltage noise with a voltage smaller than a first voltage and high-voltage noise with a voltage equal to or greater than a second voltage by using the first and second abrupt MIT devices MIT1 and MIT2 for which first and second limit voltages are appropriately controlled.

The first voltage may be identical to the first limit voltage for the first abrupt MIT device MIT1, and the second voltage may be identical to the second limit voltage for the second abrupt MIT device MIT2. However, the first and second voltages may differ from the first and second limit voltages according to the protecting resistors $R_{p1}$ and $R_{p2}$ serially connected to the first and second abrupt MIT device MIT1 and MIT2, respectively, and the electrical and/or electronic system $Z_L$. For the purpose of the present invention, the second limit voltage must be higher than the first limit voltage.

Even in the case including the second abrupt MIT device MIT2, another abrupt MIT device is further included, being connected to the second abrupt MIT device MIT2 in parallel, whereby the overall resistance of the second abrupt MIT device MIT2 decreases. Hence, overflow of current in a single abrupt MIT device can be prevented.

Although the application of noise via the power line L1 for the power voltage source $V_p$ is illustrated in the embodiment of FIG. 8, this embodiment may also be applied to a case where the noise is applied via a signal line for a signal source. Even when both a power voltage and a signal are applied to the electrical and/or electronic system $Z_L$ via their corresponding lines or an identical line, the low-voltage noise preventing circuit 200 is applied to each of the power line and the signal line to thereby remove both low-voltage noise and high-voltage noise.

Figure 9:
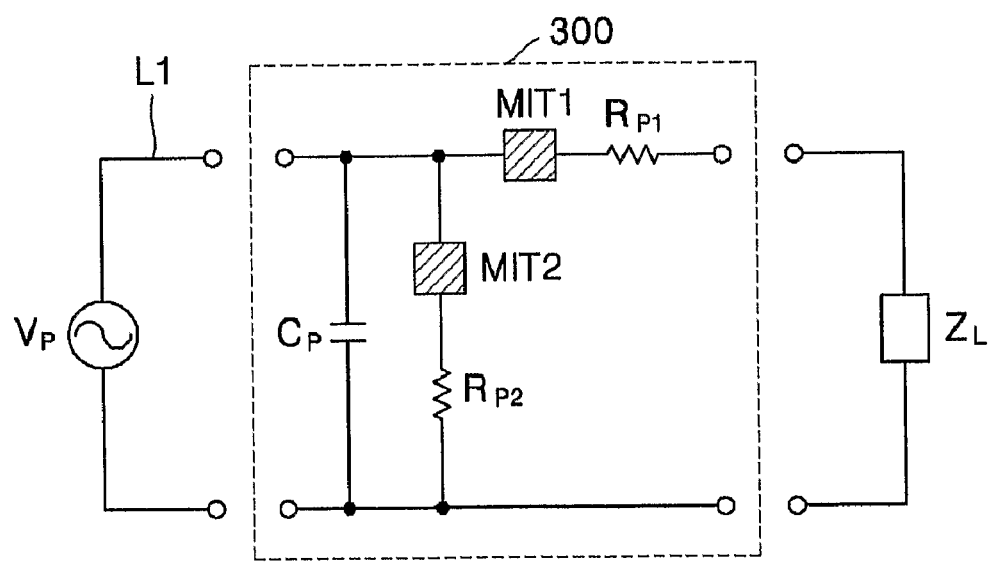
FIG. 9 illustrates a circuit including a low-voltage noise preventing circuit, according to another embodiment of the present invention.

FIG. 9 illustrates a circuit including a low-voltage noise preventing circuit 300, according to another embodiment of the present invention. Referring to FIG. 9, the low-voltage noise preventing circuit 300 is similar to the low-voltage noise preventing circuit 200 except that a power voltage reinforcing capacitor $C_p$ connected to the power supply voltage $V_p$ in parallel is further included. The power voltage reinforcing capacitor $C_p$ prevents the power voltage of the power voltage source $V_p$ from dropping at the moment when an abrupt MIT occurs in the second abrupt MIT device MIT2 connected to the power supply voltage $V_p$ in parallel.

A circuit including a low-voltage noise preventing circuit according to an experiment of the present invention and the removal of low-voltage noise by the circuit will now be described with reference to FIGS. 10 through 12.

Figure 10:
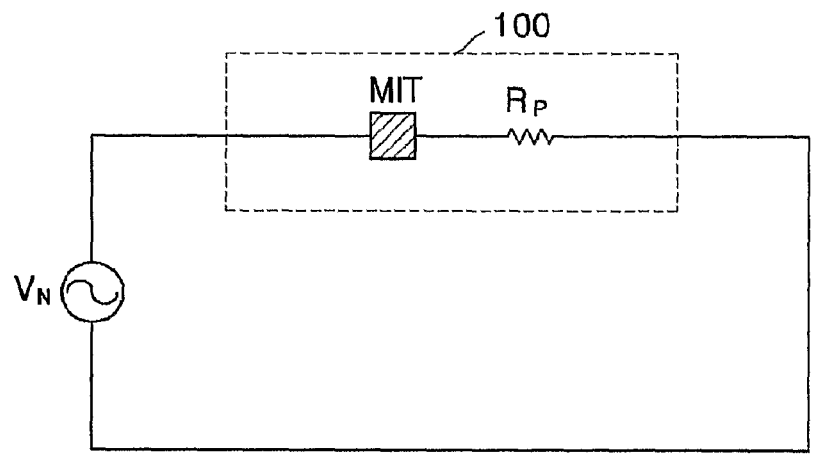
FIG. 10 illustrates a circuit including the low-voltage noise preventing circuit shown in FIGS. 6 and 7, according to an experiment of the present invention.

FIG. 10 illustrates a circuit including the low-voltage noise preventing circuit 100, according to an experimental example of the present invention. For the purpose of the experiment, the circuit omits the electrical and/or electronic system $Z_L$, and further includes a noise generator $V_N$ that generates a noise signal. The low-voltage noise preventing circuit 100 is the same as the low-voltage noise preventing circuit 100 shown in FIGS. 6 and 7.

The abrupt MIT device MIT used in this experiment corresponds to the planar-type abrupt MIT device of FIG. 2 and includes the transition thin film 730 formed of vanadium oxide. The distance d between the first and second electrode thin films 741 and 742 is about 5 μm. The protecting resistor $R_p$ for protecting the abrupt MIT device MIT has a resistance of 500Ω.

Figure 11:
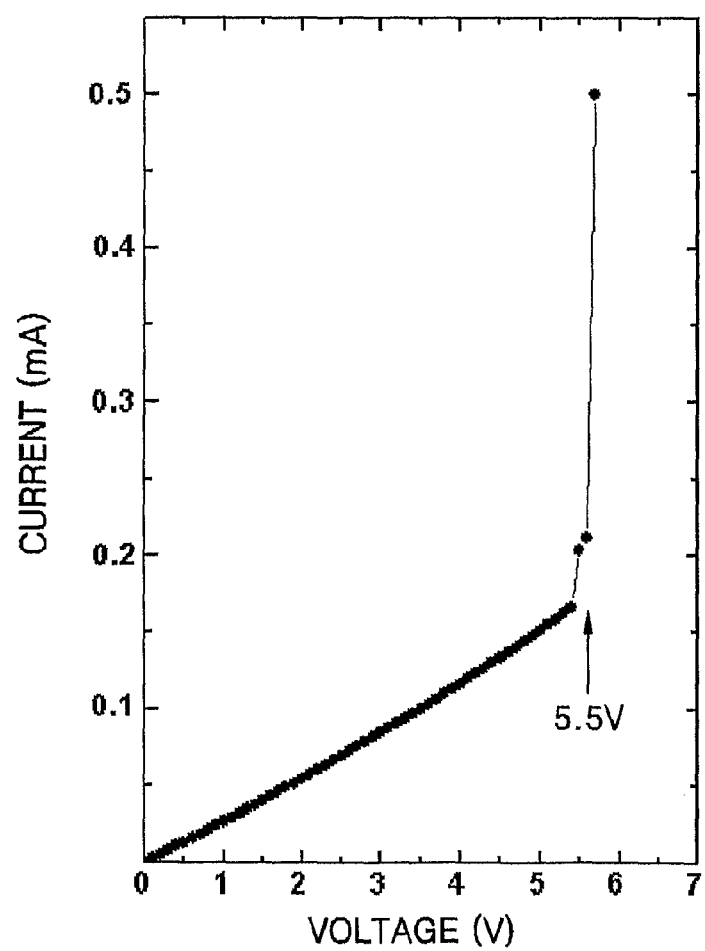
FIG. 11 is a graph showing a current-voltage of the abrupt MIT device shown in FIG. 10.

FIG. 11 is a graph showing a current-voltage curve of the abrupt MIT device of FIG. 10. The current flowing in the abrupt MIT device MIT was limited to 0.5 mA at most to protect the abrupt MIT device MIT from excessive current.

In FIG. 11, voltage expressed in the unit of V on the x axis denotes a voltage dropping at both ends of the abrupt MIT device MIT, and current expressed in the unit of mA (miliAmpere) on the y axis denotes current passing through the abrupt MIT device MIT. The abrupt MIT device MIT has a characteristic of an insulator in that little current flows between dropping voltages of 0V and about 5.5V. When the dropping voltage is about 5.5V or greater, the current discontinuously jumps, because an electrical characteristic of the abrupt MIT device transits from the insulator to a metallic material. Accordingly, the limit voltage of the abrupt MIT device MIT used in this experiment is about 5.5V. A resistance of the abrupt MIT device MIT can be calculated from the voltage-current curve of FIG. 11.

Figure 12:
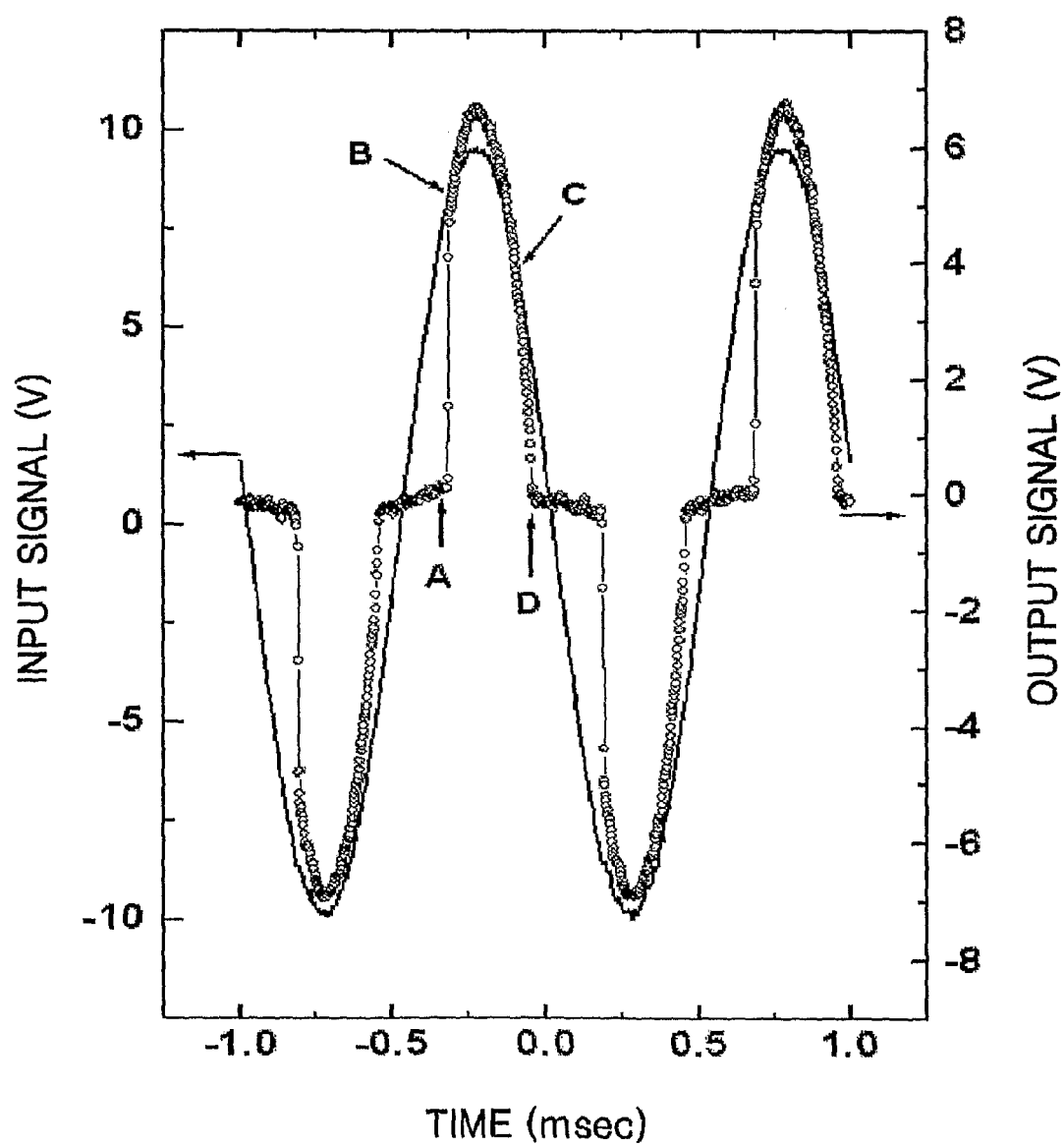
FIG. 12 is a graph showing a phenomenon in that a low-voltage noise signal is suppressed by the circuit of FIG. 10.

FIG. 12 is a graph showing a phenomenon in that a low-voltage noise signal is suppressed by the circuit of FIG. 10. In the graph of FIG. 12, a sine wave noise signal with a maximum voltage of 10V and a frequency of 1 KHz generated by the noise generator $V_N$ and input to the abrupt MIT device MIT is referred to as an input signal, and the sine wave noise signal output by the abrupt MIT device MIT and caught at both ends of the protecting resistor $R_p$ using a digital oscilloscope is referred to as an output signal. In FIG. 12, the input signal is drawn in a thicker solid line, and the output sine wave noise signal is drawn in a thinner solid line including small circles. The left vertical axis indicates the voltage of the input sine wave noise signal, and the right vertical axis indicates the voltage of the output sine wave noise signal.

Referring to FIG. 12, when the input sine wave noise signal has a voltage of about 7.5 V or less, namely, at portion B, the input signal fails to pass through the abrupt MIT device MIT, resulting in an output signal having almost 0V (which is indicated by portion A). Even when the voltage of the input signal decreases, that is, between portions C and D, transition from a metal material to an insulator still occurs, but is not as abrupt as when the voltage of the input signal increases. This is because the resistance of the abrupt MIT device in the metal state calculated in the circuit of FIG. 10 is 325Ω, which is large for the abrupt MIT device. In other words, the slow transition upon the voltage increase occurs due to heat generation caused by a large resistance. A well-manufactured abrupt MIT device has a resistance of several Ω, so that the heat generation is too weak to be ignorable.

An abrupt MIT device included in a low-voltage noise preventing circuit according to the present invention serves as a filter that filters out a voltage lower than a predetermined rated voltage to prevent the voltage from passing through the abrupt MIT device. Thus, when the limit of the abrupt MIT device is controlled according to a demanded voltage of an electric and/or electronic system to be protected, low-voltage noise can be effectively removed.

Since the abrupt MIT device performs a filter function, it may also serve as an analog-to-digital converter (ADC) or a decoder. For example, a signal with a voltage less than a limit voltage for an abrupt MIT device is output as 0, and a signal with a voltage equal to or greater than the limit voltage is output as 1, whereby the analog signals are converted into the digital signals 0 and 1. Several abrupt MIT devices having different limit voltages are connected to one another in parallel and receive signals, such that conversion to digital signals corresponding to more than two bits is possible.

The abrupt MIT device is serially connected to an electric and/or electronic system to be protected from low-voltage noise, so that the low-voltage noise, having a voltage less than the limit voltage for the abrupt MIT device, can be removed.

In addition, the low-voltage noise preventing circuit according to the present invention further includes a separate abrupt MIT device in addition to the abrupt MIT device serially connected to the electric and/or electronic system, and the additional abrupt MIT device is connected to the electric and/or electronic system in parallel. Accordingly, not only the low-voltage noise but also high-voltage noise can be removed.

Furthermore, the abrupt MIT device performs a filter function and accordingly may also serve as an ADC.

Also, the abrupt MIT device is very simple and thus can be manufactured easily at a low cost. Therefore, the low-voltage noise preventing circuit using the abrupt MIT device can also be manufactured easily with a low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A low-voltage noise preventing circuit comprising an abrupt metal-insulator transition (MIT) device serially connected to an electrical and/or electronic system to be protected from noise.

2. The low-voltage noise preventing circuit of claim 1, further comprising a protecting resistor serially connected to the abrupt metal-insulator transition device.

3. The low-voltage noise preventing circuit of claim 1, wherein:
the noise is received via a power line which applies a power voltage to the electrical and/or electronic system; and
the abrupt metal-insulator transition device is connected to the power line.

4. The low-voltage noise preventing circuit of claim 1, wherein:
the noise is received via a signal line which receives a signal from and outputs the signal to the electrical and/or electronic system; and
the abrupt metal-insulator transition device is connected to the signal line.

5. The low-voltage noise preventing circuit of claim 1, wherein:
the noise is received via the power line which applies the power voltage to the electrical and/or electronic system and via the signal line which receives the signal from and outputs the signal to the electrical and/or electronic system; and
the low-voltage noise preventing circuit includes abrupt metal-insulator transition devices connected to the power line and the signal line.

6. The low-voltage noise preventing circuit of claim 5, further comprising protecting resistors serially connected to the abrupt metal-insulator transition devices.

7. The low-voltage noise preventing circuit of claim 1, further comprising at least one abrupt metal-insulator transition device connected in parallel to the abrupt metal-insulator transition device.

8. The low-voltage noise preventing circuit of claim 1, wherein electrical characteristics of the abrupt metal-insulator transition device abruptly change according to a voltage level of the noise.

9. The low-voltage noise preventing circuit of claim 1, wherein the abrupt metal-insulator transition device has a characteristic of an insulator below a predetermined limit voltage and has a characteristic of a metal at or over the limit voltage.

10. The low-voltage noise preventing circuit of claim 9, wherein the electrical and/or electronic system is protected from noise with a voltage less than the limit voltage.

11. A low-voltage noise preventing circuit comprising:
a first abrupt metal-insulator transition device serially connected to an electrical and/or electronic system to be protected from noise; and
a second abrupt metal-insulator transition device connected to the electrical and/or electronic system in parallel.

12. The low-voltage noise preventing circuit of claim 11, further comprising a first protecting resistor and a second protecting resistor serially connected to the first and second abrupt metal-insulator transition devices, respectively.

13. The low-voltage noise preventing circuit of claim 11, further comprising a power voltage reinforcing capacitor connected in parallel to a power voltage source which supplies a power voltage to the electrical and/or electronic system.

14. The low-voltage noise preventing circuit of claim 11, further comprising at least one abrupt metal-insulator transition device connected in parallel to the first abrupt metal-insulator transition device.

15. The low-voltage noise preventing circuit of claim 11, further comprising at least one abrupt metal-insulator transition device connected in parallel to the second abrupt metal-insulator transition device.

16. The low-voltage noise preventing circuit of claim 11, wherein electrical characteristics of the first and second abrupt metal-insulator transition devices abruptly change according to voltage levels of the noises.

17. The low-voltage noise preventing circuit of claim 11, wherein:
the first abrupt metal-insulator transition device has a characteristic of an insulator below a first limit voltage and has a characteristic of a metal at or over the first limit voltage; and
the second abrupt metal-insulator transition device has a characteristic of an insulator below a second limit voltage and has a characteristic of a metal at or over the second limit voltage.

18. The low-voltage noise preventing circuit of claim 17, wherein the electrical and/or electronic system is protected from noise with a voltage less than the first limit voltage and noise with a voltage equal to or greater than the second limit voltage.

19. The low-voltage noise preventing circuit of claim 17, wherein the second limit voltage is higher than the first limit voltage.

20. A low-voltage noise preventing circuit comprising a first abrupt metal-insulator transition device that is serially connected to an electrical and/or electronic system to be protected from noise and comprises an abrupt metal-insulator transition thin film containing low-concentration holes and at least two electrode thin films that contact the abrupt metal-insulator transition thin film.

21. The low-voltage noise preventing circuit of claim 20, further comprising a second abrupt metal-insulator transition device that is connected in parallel to the electrical and/or electronic system and comprises an abrupt metal-insulator transition thin film containing low-concentration holes and at least two electrode thin films that contact the abrupt metal-insulator transition thin film.

22. The low-voltage noise preventing circuit of claim 20, wherein the abrupt metal-insulator transition thin film is formed of at least one material selected from the group consisting of an inorganic semiconductor to which low-concentration holes are added, an inorganic insulator to which low-concentration holes are added, an organic semiconductor to which low-concentration holes are added, an organic insulator to which low-concentration holes are added, a semiconductor to which low-concentration holes are added, an oxide semiconductor to which low-concentration holes are added, and an oxide insulator to which low-concentration holes are added, wherein the above-described materials each include at least one of oxygen, carbon, a semiconductor element (i.e., groups III-V and groups II-IV), a transition metal element, a rare-earth element, and a lanthanum-based element.

23. The low-voltage noise preventing circuit of claim 20, wherein each of the electrode thin films is formed of at least one material selected from the group consisting of W, Mo, W/Au, Mo/Au, Cr/Au, Ti/W, Ti/Al/N, Ni/Cr, Al/Au, Pt, Cr/Mo/Au, $YB_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/W/Al.

* * * * *